United States Patent [19]

Schilp et al.

[11] 3,836,996

[45] Sept. 17, 1974

[54] SEMICONDUCTOR DARLINGTON CIRCUIT

[75] Inventors: William Henry Schilp, Flemington; Albert Alexander Todd, Piscataway, both of N.J.

[73] Assignee: RCA Corporation, New York, N.Y.

[22] Filed: Sept. 26, 1973

[21] Appl. No.: 400,974

[52] U.S. Cl. .................................................. 357/46

[51] Int. Cl. .............................................. H01l 12/00

[58] Field of Search.......................... 317/235, 22, 46

[56] References Cited

UNITED STATES PATENTS 3,624,454 11/1971 Adkinson et al.................... 317/101

*Primary Examiner*—Rudolph V. Rolinec
*Assistant Examiner*—E. Wojciechowicz

[57] ABSTRACT

A semiconductor integrated Darlington circuit is provided including an input transistor driving an output transistor, two resistors, and a diode within a body of semiconductor material. The emitter and base regions of the transistors extend to a surface of the body, and, at such surface, the base region of the input transistor is surrounded by the emitter region thereof while a portion of the base region of the output transistor is disposed between the emitter regions of the two transistors. For increasing the resistance between the base regions of the two transistors, a slot is provided through the surface at a position within the emitter region of the input transistor and between the base regions of the two transistors.

3 Claims, 7 Drawing Figures

SEMICONDUCTOR DARLINGTON CIRCUIT

This invention relates to semiconductor integrated circuits, and particularly to integrated circuits of the "Darlington" type.

A widely used electronics circuit, known as a "Darlington" circuit, comprises two transistors, two resistors, and a diode. Such circuit is now commercially available in integrated form, i.e., each of the individual components of the circuit and the various electrical interconnections therebetween are included within a single chip or pellet of semiconductor material, the semiconductor chip being encapsulated in a package having three outwardly extending terminal leads.

while such integrated Darlingtons have proven quite successful, there is, as is usually the case, room for improvements both with respect to the operating characteristics of the device and the means for fabrication thereof. In particular, in connection with such presently commercially available devices as the RCA 2N6385 and the RCA 2N6388, there is a need for significantly increasing the resistance value of one of the two circuit resistors of these devices without increasing either the complexity or cost thereof.

THE DRAWING

DETAILED DESCRIPTION

Figure 1:
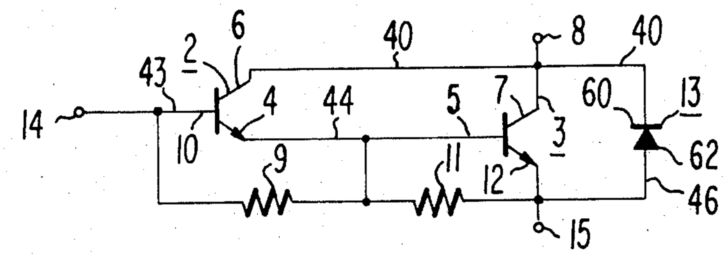
FIG. 1 is a schematic diagram of a Darlington circuit.

A schematic diagram of a Darlington circuit is shown in FIG. 1. The circuit includes a driving transistor 2 and a power output transistor 3 with the emitter 4 of the driver transistor 2 electrically connected to the base 5 of the power output transistor 3. While the transistors 2 and 3 are shown as NPN devices, the circuit may also employ PNP transistors. The collector 6 and 7 of each transistor 2 and 3, respectively, is connected to a terminal 8. A first resistor 9 is connected between the base 10 and the emitter 4 of the driving transistor 2, and a second resistor 11 is connected between the base 5 and the emitter 12 of the power output transistor 3. A diode 13 is connected between the emitter 12 and the collector 7 of the power output transistor 3. The three terminal Darlington circuit function is thus defined between a common collector terminal 8, a terminal 14 connected to the base 10 of the driving transistor 2, and a terminal 15 connected to the emitter 12 of the power output transistor 3.

Shown in FIGS. 2 – 5 and described with reference thereto is a semiconductor device which integrally contains all of the elements and interconnections of the circuit shown in FIG. 1. The device of this invention is similar to, but an improvement over, a commercially available device known as the RCA 2N6385, such device being described in U.S. Pat. No. 3,751,726, issued Aug. 7, 1973, and is also an improvement over a device disclosed in copending application S. N. 363,881, filed May 25, 1973. The device of the instant invention, generally referred to by the numeral 20 (FIG. 4), is formed in a semiconductor body 22 (e.g., silicon) having upper and lower opposed surfaces 24 and 26, respectively, and a side surface 27. An NPN device is shown in this embodiment. The device can also be of the PNP type.

The device 20 includes a highly conductive substrate 28 of N type conductivity in the body 22 adjacent to the lower surface 26, and a collector region 30 of N type conductivity adjacent to the substrate 28. The device 20 further includes a base region 32 of P type conductivity disposed in the body 22 between the upper surface 24 and the collector region 30. The base 32 and collector 30 regions are separated by a base-collector PN junction 31 which extends across the entire device 20 and intersects the side surface 27.

Figure 4:
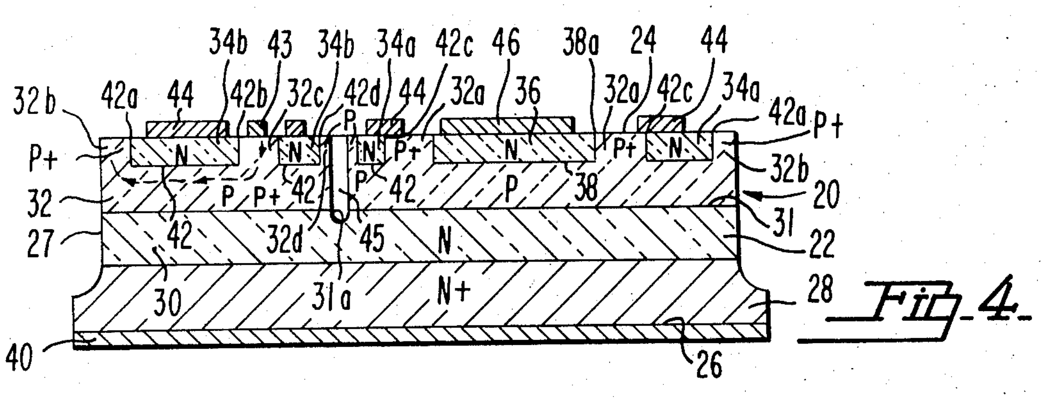
FIG. 4 is a cross-sectional view taken along the line 4—4 of FIG. 3.
Figure 5:
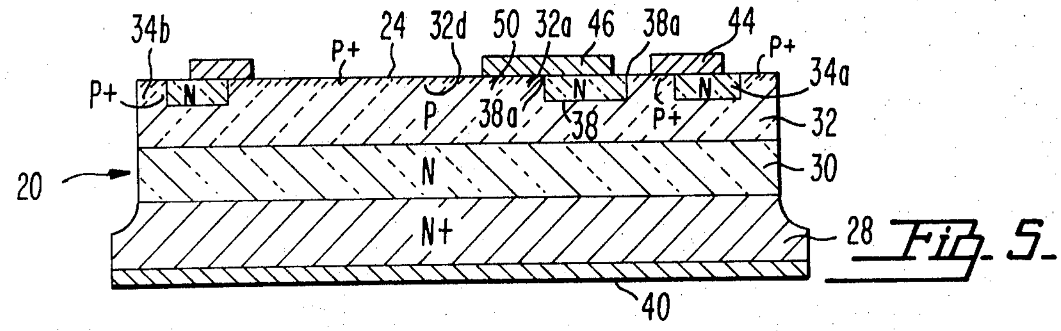
FIG. 5 is a cross-sectional view taken along line 5—5 of FIG. 3.
Figure 2:
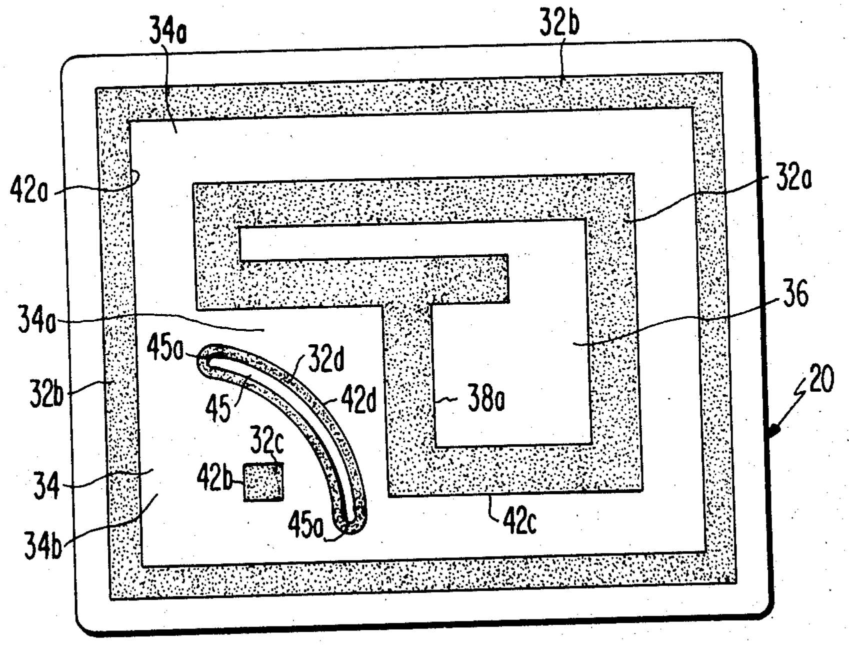
FIG. 2 is a top plan view of a semiconductor body containing various elements of the circuit of FIG. 1, the metallization pattern used to interconnect various ones of the elements not being present.
Figure 3:
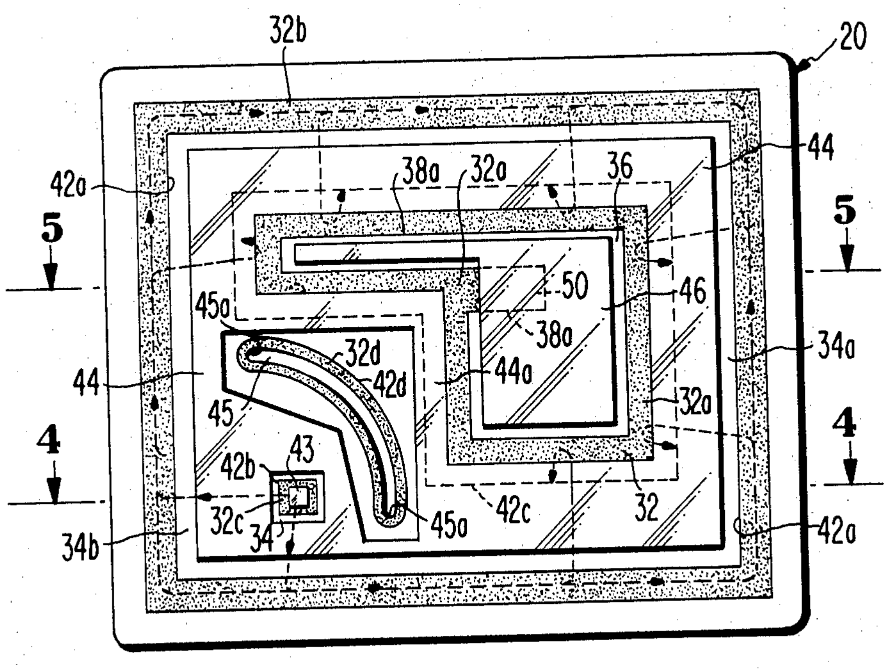
FIG. 3 is a view similar to that of FIG. 2, the metallization pattern, however, being present.

Extending into the base region 32 from the surface 24 of the body 22 are two emitter regions 34 and 36. For ease of visualization, the base region 32, where visible in FIGS. 2 and 3, is stippled. With reference to FIGS. 2 and 4, the emitter region 36, associated with the output transistor of the device, as hereinafter explained, is completely encircled by a portion 32a of the base region 32, the portion 32a extending to the surface 24 of the body 22. The emitter region 36 forms a PN junction 38 with the base region 32, the PN junction 38 having an intercept 38a with the surface 24 of the body 22.

The other emitter region 34, associated with the driver transistor of the circuit, is likewise completely encircled by portion 32b of the base region 32, this encircling portion 32b being disposed about the upper periphery of the body 22. The emitter region 34 comprises a number of connected loops. One loop *34a* (FIG. 2) of the emitter region 34 extends completely around the emitter 36 and is separated therefrom by the portion *32a* of the base region 32. Another loop *34b* of the emitter 34 surrounds a portion *32c* of the base region 32. Disposed between the two loops *34a* and *34b*, and surrounded by the emitter region 34 at the surface 24 of the body 22, is a portion *32d* of the base region 32.

The emitter 34 forms a PN junction 42 (FIG. 4) with the base region 32, the intercepts of the junction 42 with the surface 24 of the body 22 forming four closed loops *42a*, *42b*, *42c*, and *42d*.

Extending into the body 22 from the surface 24 thereof is a moat or slot 45. As shown in FIGS. 2 and 3, the opening of the slot 45 is entirely surrounded by the base region portion *32d*, and, as shown in FIG. 4, the slot 45 extends through the base region 32 and into the collector region 30. The purpose of the slot 45, as described more fully hereinafter, is to increase the resistance of the resistor 9 shown in the FIG. 1 circuit.

To the extent so far described, the output transistor 3 of the Darlington circuit shown in FIG. 1 can be recognized as comprising the emitter region 36 (FIG. 4), the portion of the base region 32 forming the PN junction 38 with the emitter region 36, and the portion of the collector region 30 generally below these emitter and base portions.

The driver transistor 2 of the circuit comprises the portion 34*b* of the emitter region 34 surrounding the base region portion 32*c*, the base region portion 32*c* forming the PN junction 42 with the emitter region 34, and the portions of the collector region 30 below these emitter and base portions.

To provide the remaining components of the Darlington circuit and the interconnections therefor, metal contacts, e.g., of lead or a lead-tin alloy, are provided on the surfaces 24 and 26 of the body 22. Thus, as shown in FIG. 4, a metal contact 40 is provided on the surface 26 ohmically contacting the substrate 28 and thus ohmically connected to the collector region 30 of both transistors of the circuit. A metal contact 43 is ohmically connected to the base region portion 32*c* which is surrounded by the portion 34*b* of the emitter region 34.

Two other metal contacts 44 and 46 are provided each connected to a different one of the emitter regions 34 and 36, respectively, and also to the base region 32. This is best shown in FIG. 3, wherein, for ease of visualization, the various metal contacts are shown shaded. Thus, as shown, the metal contact 46 is disposed substantially within the confines of the PN junction surface intercept 38a with the exception of an ohmic connection of the metal contact 46 with a tongue or channel 50 of the portion 32*a* of the base region 32 which extends into the emitter region 36 beneath the contact 46 (see also FIG. 5). The channel 50 provides the diode 13 of the circuit shown in FIG. 1, as hereinafter described.

The other metal contact 44 is ohmically connected to the emitter region 34. As shown in FIG. 3, the contact 44 is disposed entirely within the surface intercept 42*a* of the PN junction 42, and entirely surrounds, while not touching, the junction surface intercepts 42*b* and 42*d*. With respect to the surface intercept 42*c* of the PN junction 42, however, the contact 44 extends over and beyond the entire length of the surface intercept 42*c* and is thus ohmically connected to the base portion 32*a* surrounding the emitter region 36.

For the purpose of improving the ohmic contacting of the contacts 44 and 46 with the various portions of the surface 24 of the semiconductor body 22, a relatively shallow portion of the body 22 beneath the surface 24 is doped to a relatively high conductivity. For example, in the fabrication of the device, the starting workpiece may comprise a body of semiconductor material of the conductivity of the substrate 28. An epitaxial layer 30 having a thickness in the order of 12 – 14 micrometers and doped with phosphorous to a resistivity of about 3 ohm-cm is then formed on the substrate 28. The base region 32 is then formed by epitaxially growing boron doped silicon at a resistivity of about 10 ohm-cm onto the layer 30 to a thickness of about 20 micrometers. Then, to provide the high surface conductivity, boron is deposited onto the wafer surface to a surface concentration of about $10^{18}$atoms/cm$^2$, and driven into the body 22 to a depth of about 2 micrometers. This shallow surface portion of high conductivity is designated by a P+ symbol. The various N emitter regions are thereafter formed by diffusion of phosphorous, from a surface concentration of about $5 \times 10^{20}$atoms/cm$^2$, to a depth of about 10 micrometers into selected portions of the previously formed base region 32.

During the diffusion step to provide the shallow surface portion of high conductivity, the portion of the base region 32 corresponding to what is to become the portion 32d (FIG. 2) is covered with a diffusion masking layer with the result that the surface conductivity of this portion is not increased, remaining at a resistivity of about 10 ohm-cm. This surface portion of lower conductivity is designated by a p symbol in FIG. 4. The purpose of this surface portion of lower conductivity, described in greater detail hereinafter, is to reduce the amount of current which can flow around the slot 45 along the surface 24 of the body 22 during operation of the device.

The Darlington circuit shown in FIG. 1 is comprised in the device 20 as follows.

The circuit interconnection between the collectors 6 and 7 of the two transistors 2 and 3, respectively, is the substrate region 28 and the contact 40 on the lower surface 26 of the body 22. The interconnection between the emitter 4 of the transistor 2 and the base 5 of the transistor 3 is the metal contact 44 (FIGS. 3 and 4) which contacts both the emitter region 34 and the portion 32a of the base region 32. The diode 13, connected between the collector 7 and the emitter 12 of the transistor 3, comprises the channel 50 (FIGS. 3 and 5) of the base region 32 and the portion of the collector region 30 directly therebeneath. That is, the cathode 60 of the diode 13 is the N conductivity type collector region 30, the diode anode 62 is the P conductivity type channel 50; and the interconnection between the diode anode 62 and the emitter 12 of the transistor 3 is the contact 46 which contacts both the channel 50 and the emitter region 36. The resistor 11 comprises the resistance of the portion 32*a* of the base region 32 between the edges of the two contacts 44 and 46 at the mouth of the channel 50.

The resistor 9 is a distributed resistance comprising a number of paths for current through the base region 32 (shown by arrowed lines in FIGS. 3 and 4), the current paths extending from the base region contact 43 into the base region portion 32*c*, beneath one portion of the loop 34*b* of the emitter region 34 (the portion of the loop 34*b* to the left in FIG. 4), through the base region portion 32*b* at the periphery of the body 22, back under the loop 34*a* of the emitter region 34, and finally to the metal contact 44 where it extends over the junction surface intercept 42*c* and contacts the base region portion 32*a*.

The value of the resistor 9 is a function of the resistivity of the base region portions through which the current flows and the length of the various current paths. As shown in FIG. 3, some of these current paths are quite long, extending peripherally about the body 22 (through the peripherally disposed base portion 32*b*) to the portions of the metal contact 44 disposed diagonally across the body 22 and furthest removed from the base contact 43. Such long current paths contribute high resistance components to resistor 9 and serve to increase the resistance value thereof.

The purpose of the slot 45 is to intercept or cut-off much shorter, lower resistance circuit paths that would otherwise exist between the base contact 43 and the portion 44*a* of the contact 44 directly opposite and at a short distance from the contact 43. Such current paths, if not otherwise intercepted by the slot 45, would significantly reduce the value of the resistor 9.

The portion 44$a$ of the contact 44 cannot be omitted in this structure, thus possibly eliminating or at least reducing the need for the slot 45, since the contact 44 provides the input (see FIG. 1) to the base 5 of the output transistor 3. Omission of the contact portion 44$a$ would thus decouple a significant portion of the base region 32$a$ of the output transistor 3 contacted by the contact portion 44$a$, and would thus significantly decrease the output of the circuit. Thus, the combination of the contact portion 44$a$ with the slot 45 provides for full utilization of the base region of the output transistor while increasing the resistance to current between the bases of the two transistors of the circuit.

As previously noted, the conductivity of the base region portion 32d at the surface 24 of the body 22 is deliberately not increased at the time when the surface conductivity of other portions of the base region 32 is increased. If present, such a high surface conductivity at the base region portion 32$d$, it is found, provides relatively low resistance paths for current around the slot 45. That is, with such a high surface conductivity, current from the base contact 43 can pass towards the slot 45 (FIG. 4) beneath the emitter loop portion 34$b$ to the base region portion 32$d$, to the surface 24 surrounding the slot 45, along the surface 24 around the ends 45$a$ (FIG. 3) of the slot 45, and then beneath a portion of the emitter loop 34$a$ (FIG. 4) to the base region portion 32$a$ where it is contacted by the metal contact 44. Conversely, by maintaining the surface conductivity of the base region portion 32$d$ at a relatively low value, as described herein, much of such current around the slot 45 is prevented, and the resistance of the resistor 9 is increased by as much as 100 percent.

To prevent current flow beneath the slot 45, the slot 45 extends into the collector region 30, the junction 31 between the base region 32 and the collector region 30 being effective to prevent such current flow. As shown in FIG. 4, the base of collector junction intercepts the walls of the slot 45 at a junction intercept 31$a$. The significance of this is discussed hereinafter.

Figure 6:
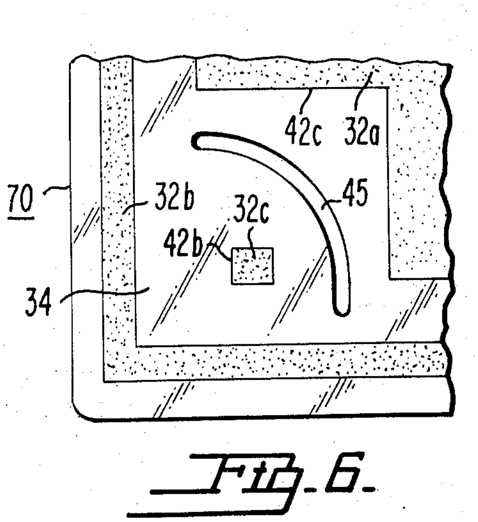
FIGS. 6 and 7 are views similar to FIGS. 2 and 6, respectively, showing portions only of a device slightly different from the device shown in FIGS. 2 – 5.
Figure 7:
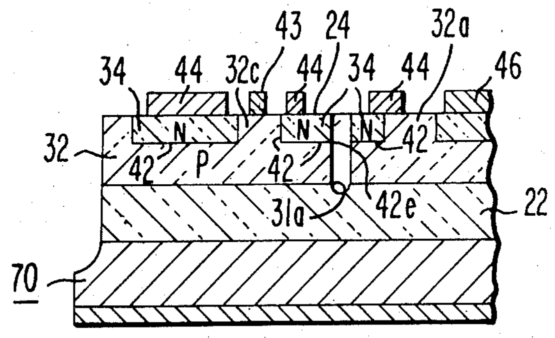

In FIGS. 6 and 7 is shown a device substantially identical to the device 20 shown in FIGS. 2 through 5, but having a slot 45 which is not surrounded by base region material (i.e., such as the base region portion 32$d$ surrounding the slot 45 in the device 20). That is, in this device 70, except for the slot 45, the emitter region 34 is continuous between the base region portion 32$c$ and the base region portion 32$a$ at the surface 24 of the body 22. In this device, as shown in FIG. 7, the junction 42 between the emitter region 34 and the base region 32 intercepts the walls of the slot 45 at a surface intercept 42$e$.

The device 70 is operable, and is an improvement over the prior art, in that the slot 45 is effective to increase the value of the resistor 9 of the circuit shown in FIG. 1. That is, as is the case with the device shown in FIGS. 2 through 5, the presence of the slot 45 is effective to intercept otherwise short, and low resistance paths for current between the base region portions 32$c$ and 32$a$.

One problem associated with the device 70, however, is that occasionally, on a non-predictable basis, various ones of such devices 70 exhibit a relatively high emitter to collector leakage current. After some analysis, the cause of this problem was traced to the fact that the spacing between the emitter-base junction slot intercept 42$e$ and the base-collector junction slot intercept 31$a$ is relatively small. That is, depending upon the cleanliness and condition of the surface of the walls of the slot 45, the close spacing between these two junction surface intercepts can give rise to relatively large leakage currents therebetween.

This problem is substantially overcome in devices of the type shown in FIGS. 2 – 5 wherein the slot 45 is separated from the emitter region 34 by the base region portion 32$d$. The result of this is that the emitter base junction does not intercept the walls of the slot 45, but rather intercepts the surface 24 of the body 22 at the intercept 42$d$, the intercept 42 being spaced from the edge of the slot 45 by the width of the base region portion 32$d$, e.g., a distance of 1 mil. This greatly increases the distance between the emitter to base junction surface intercept and the collector to base surface intercept (e.g., from a spacing in the order of 0.4 mil. in the FIG. 7 embodiment to a spacing in the order of 1.4 in the FIG. 4 embodiment), and significantly reduces the emitter to collector leakage. Also, although not shown, a layer of passivating material, e.g., silicon dioxide, is normally provided on the surface 24 of the body 22. This layer, which overlies the emitter-base junction surface intercept 42$b$ in the device 20, "passivates" the junction intercept 42$b$ and is quite effective in preventing leakage currents across the junction intercept.

The base region portion 32$d$ (FIGS. 2 and 4) is, as noted, separated from the base region portion 32$a$ across the surface of the body 24 by the emitter portion 34$a$. If such separation were not present, relatively short paths for current would be present from the base region portion 32$c$ beneath the loop portion 34$b$ between the base portion 32c and the slot 45, then around the ends 45$a$ of the slot 45 directly to (in the absence of the intervening emitter portion 34$a$) the base portion 32$a$.

What is claimed is:

1. A semiconductor integrated circuit comprising:

a body of semiconductor material having a surface, various regions within said body forming emitter, base, and collector regions of two transistors, said emitter and base regions extending into said body from said surface, and said collector region underlying, within said body, portions of said emitter and base regions, a first base region of one of said transistors separating, at said surface, the emitter regions of said two transistors, and a second base region of the other of said transistors being separated, at said surface, from said first base region by a first emitter region of said other transistor, and a slot in said body within said first emitter region between said first and said second base regions, said slot extending from said surface into said collector region.

2. An integrated circuit as in claim 1 including a metal contact on said surface, said contact connecting together said first emitter region and said first base region, and said metal contact being disposed in general surrounding relation with said slot.

3. A semiconductor integrated circuit as in claim 2 including a second emitter region of said other transistor substantially surrounding, at said surface, said first base region of said one transistor.

* * * * *